United States Patent [19]
Lee et al.

[11] Patent Number: 5,229,316
[45] Date of Patent: Jul. 20, 1993

[54] SEMICONDUCTOR PROCESSING METHOD FOR FORMING SUBSTRATE ISOLATION TRENCHES

[75] Inventors: Roger R. Lee; Fernando González, both of Boise, Id.

[73] Assignee: Micron Technology, Inc., Boise, Iowa

[21] Appl. No.: 869,614

[22] Filed: Apr. 16, 1992

[51] Int. Cl.[5] .......................................... H01L 21/76
[52] U.S. Cl. ........................................ 437/67; 437/72; 437/63; 437/978; 148/DIG. 50
[58] Field of Search .................. 437/67, 72, 63, 64, 437/978; 257/395–399, , 374, 510, 513, 519, 520, 647, 648; 148/DIG. 50

[56] References Cited

U.S. PATENT DOCUMENTS

| | | | |
|---|---|---|---|
| 4,307,180 | 12/1981 | Pogge | 257/510 |
| 4,571,819 | 2/1986 | Rogers et al. | 148/DIG. 50 |
| 4,631,803 | 12/1986 | Hunter et al. | 437/67 |
| 4,740,480 | 4/1988 | Ooka | 437/67 |
| 4,965,217 | 10/1990 | Desilets et al. | 437/203 |
| 5,006,482 | 4/1991 | Kerbaugh et al. | 437/67 |

FOREIGN PATENT DOCUMENTS 0102045 6/1982 Japan ........................................ 437/67
0257244 10/1988 Japan ........................................ 437/67

Primary Examiner—Brian E. Hearn
Assistant Examiner—Trung Dang
Attorney, Agent, or Firm—Wells, St. John, Roberts, Gregory & Matkin

[57] ABSTRACT

A semiconductor processing method for forming a substrate isolation trench includes the following steps: a) providing a layer of selected material atop a substrate to a selected thickness; b) providing a sacrificial layer of a selected etch stop material to a selected thickness atop the layer of selected material; c) patterning and etching through the sacrificial layer and selected material layer, and into the substrate to define an isolation trench; d) depositing a trench filling material to a selected thickness atop the substrate and within and filling the isolation trench; e) planarize etching the trench filling material using the sacrificial layer as an effective etch stop for such planarize etching; f) etching the sacrificial layer from the substrate and thereby leaving a pillar of trench filling material projecting upwardly relative to an upper substrate surface; and g) selectively etching the projecting pillar relative to the upper substrate surface.

24 Claims, 9 Drawing Sheets

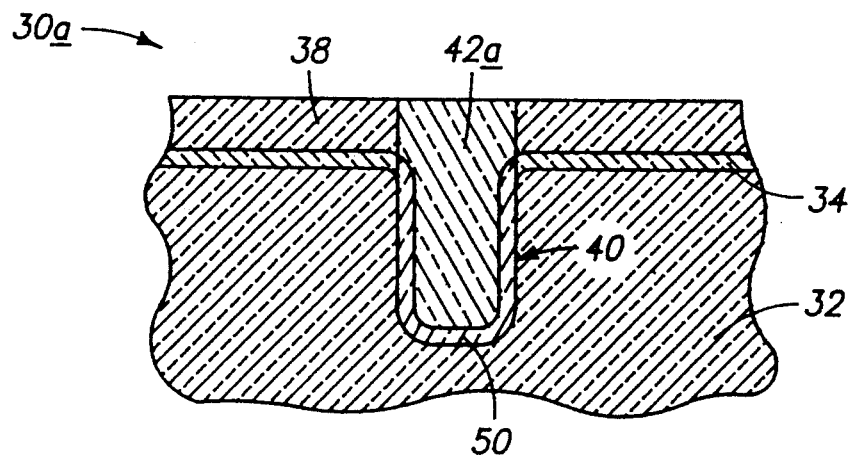
_Fig. 17_
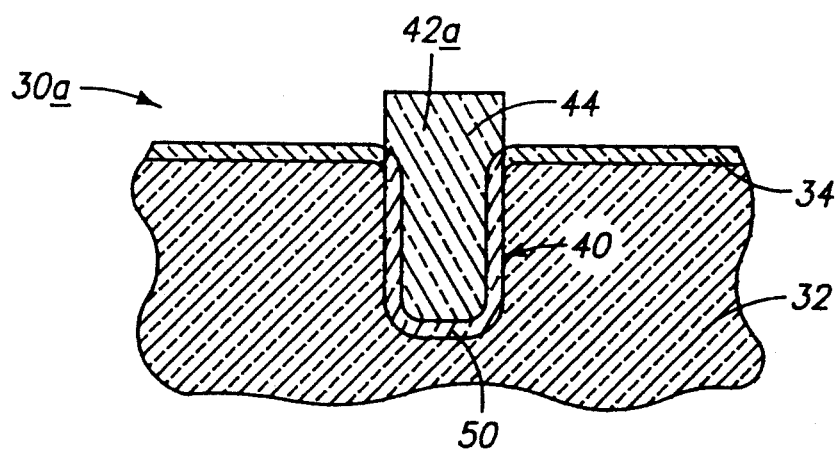
_Fig. 18_

SEMICONDUCTOR PROCESSING METHOD FOR FORMING SUBSTRATE ISOLATION TRENCHES

TECHNICAL FIELD

This invention relates to trench isolation methods in semiconductor processing.

BACKGROUND OF THE INVENTION

Integrated circuits are chemically and physically integrated into a substrate, such as a silicon wafer, by patterning regions in the substrate and by patterning layers on the substrate. These regions and layers can be conductive for conductor and resistor fabrication. They can also be of different conductivity types, which is essential for transistor and diode fabrication. When fabricating the various circuit components or devices within the substrate, it becomes necessary to isolate devices from one another.

A variety of techniques have been developed for electrically isolating devices formed within a bulk substrate in integrated circuit fabrication. One common isolation technique developed is termed LOCOS isolation for LOCal Oxidation of Silicon, which involves the formation of a semi-recessed oxide in the nonactive (or field) areas of a substrate. The principal LOCOS approach selectively grows oxide over desired field regions. This is accomplished by covering active regions with a thin layer of silicon nitride that prevents oxidation from occurring therebeneath. The nitride layer is patterned and etched to upwardly expose those silicon areas within which field oxide is desired to be grown. The wafer is thereafter subjected to oxidizing conditions. The oxide grows where there is no masking nitride. However at the edges of the nitride masking, some oxidant does diffuses laterally.

This causes the oxide to grow under and lift the nitride edges. The shape of the oxide at the nitride edges is that of a slowly tapering oxide wedge that merges into an underlying pad oxide layer, and has been termed as a bird's beak. The bird's beak is a lateral extension of the field oxide into the active areas of the devices. One drawback of such an isolation technique is that the bird beak results in field oxide being produced which has greater lateral dimensions than the minimum photo feature size utilized to create the mask opening in the nitride.

Accordingly as device geometry reached submicron size, conventional LOCOS isolation technologies reach the limits of their effectiveness, and alternate isolation processes for CMOS and bipolar technologies were needed. One such technique includes trench isolation. Here, filled isolated trenches are provided vertically into the substrate which separate or isolate electric devices on either side of the trench. This invention concerns processing methods for forming such substrate isolation trenches.

One such prior art isolation trench technique and problems associated therewith are described with reference to FIGS. 1-5. FIG. 1 illustrates a semiconductor substrate 10 comprised of a bulk substrate 12, a thin layer of pad oxide 14 and a layer of photoresist 16. Photoresist layer 16 is patterned to produce a contact opening 20 through which a trench is to be formed.

Referring to FIG. 2, pad oxide layer 14 and bulk substrate 12 are etched as indicated to produce a cavity or trench 22.

Referring to FIG. 3, a layer 24 of $SiO_2$ is grown within trench 22. An additional isolation implant 26 can also be provided at the base of trench 22, as shown. For example where bulk substrate 12 comprises p− silicon where n-channel devices will be provided therein, implant 26 could be a p+ implant to provide further electrical isolation effect between circuit components to be developed on opposing sides of trench 22. Such implant would typically be provided before the removal of mask layer 16 shown in FIG. 1.

Referring to FIG. 4, a layer 28 of trench filling material is provided atop the wafer to fill trench 22. The material of layer 28 could be polysilicon or oxide, or some other bulk, mass of material to fill the volume of trench 22. It need not necessarily be an insulating material since oxide layer 26 provides an electrically isolating effect across the lateral extent of trench 22. Such layer is typically conformally deposited creating the illustrated depression or "V" 30 as illustrated.

Referring to FIG. 5, layer 28 is subjected to a suitable etch to remove such material to the point of leaving trench 22 substantially filled. However, as shown, and unfortunately, the conformal depositing nature of layer 28 typically results in the "V" 30a still remaining after the etch, which is undesirable.

It would be desirable to improve upon these and other techniques associated with formation of substrate isolation trenches.

BRIEF DESCRIPTION OF THE DRAWINGS

Preferred embodiments of the invention are described below with reference to the following accompanying drawings.

FIG. 17 is a view of the FIG. 14 wafer at a processing step subsequent to that illustrated by FIG. 16.

FIG. 18 is a view of the FIG. 14 wafer at a processing step subsequent to that illustrated by FIG. 17.

DETAILED DESCRIPTION OF PREFERRED EMBODIMENTS

Figure 1:
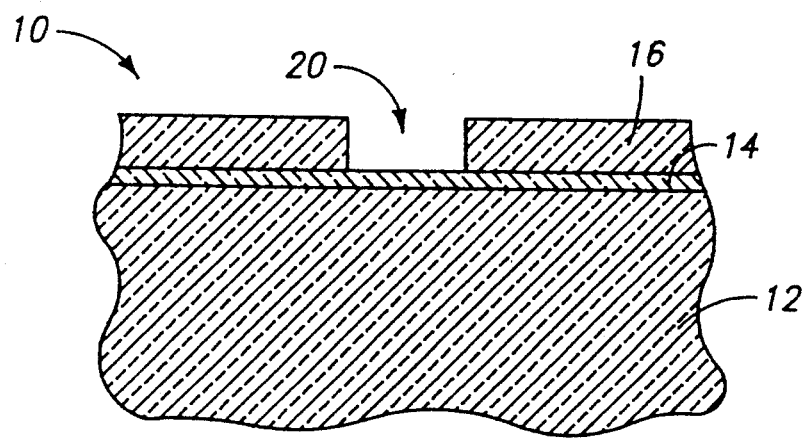
FIG. 1 is a diagrammatic section of a semiconductor wafer fragment processed in accordance with prior art methods, and is discussed in the "Background" section above.
Figure 2:
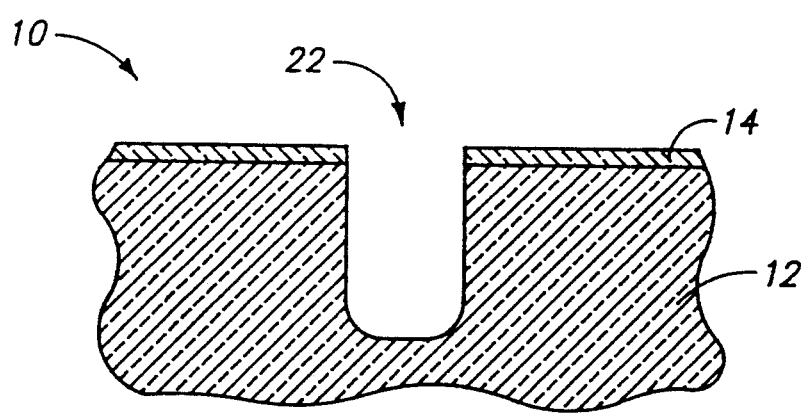
FIG. 2 is a view of the FIG. 1 wafer at a prior art processing step subsequent to that illustrated by FIG. 1.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method for forming a substrate isolation trench comprises the following steps:

providing a layer of selected material atop a substrate to a selected thickness;

providing a sacrificial layer of a selected etch stop material to a selected thickness atop the layer of selected material;

patterning and etching through the sacrificial layer and selected material layer, and into the substrate to define an isolation trench;

depositing a trench filling material to a selected thickness atop the substrate and within and filling the isolation trench;

planarize etching the trench filling material using the sacrificial layer as an effective etch stop for such planarize etching;

etching the sacrificial layer from the substrate and thereby leaving a pillar of trench filling material projecting upwardly relative to an upper substrate surface; and selectively etching the projecting pillar relative to the upper substrate surface.

More specifically and in accordance with a further aspect of the invention, a method of forming substrate isolation trenches comprises:

providing a layer of first material atop a substrate to a first selected thickness;

providing a layer of polysilicon atop the substrate to a second selected thickness;

providing a sacrificial layer of a selected etch stop material to a third selected thickness atop the layer of polysilicon, the etch stop material being selectively etchable relative to polysilicon;

patterning and etching through the sacrificial layer, polysilicon layer and layer of first material, and into the substrate to define an isolation trench;

depositing a layer of oxide to a fourth selected thickness atop the substrate and within the isolation trench to fill the isolation trench, the etch stop material being selectively etchable relative to oxide;

planarize etching the trench filling oxide using the sacrificial layer as an effective etch stop for such planarize etching;

etching the sacrificial layer from the substrate selectively relative to the trench filling oxide and polysilicon layer, and thereby leaving a pillar of oxide projecting upwardly relative to the polysilicon layer;

selectively etching the projecting pillar relative to the polysilicon layer; and etching the polysilicon layer from the substrate selectively relative to the first material and trench filling oxide.

In accordance with yet a further aspect of the invention, a substrate isolation trench forming process comprises:

providing a first layer of oxide atop a substrate to a first selected thickness;

providing a sacrificial layer of a selected etch stop material to a third selected thickness atop the oxide layer of polysilicon, the etch stop material being selectively etchable relative to oxide;

patterning and etching through the sacrificial layer and oxide layer, and into the substrate to define an isolation trench;

providing a trench coating insulating layer within the trench;

depositing a layer of polysilicon to a fourth selected thickness atop the substrate and within the isolation trench to fill the isolation trench, the etch stop material being selectively etchable relative to polysilicon;

planarize etching the trench filling polysilicon using the sacrificial layer as an effective etch stop for such planarize etching;

etching the sacrificial layer from the substrate selectively relative to the trench filling polysilicon and first oxide layer, and thereby leaving a pillar of polysilicon projecting upwardly relative to the first oxide layer; and selectively etching the projecting pillar relative to the first oxide layer.

More specifically and first with reference to FIGS. 6-13, a semiconductor substrate at a processing step in accordance with the invention is indicated generally by reference numeral 30, and is comprised in part of a bulk substrate material 32. Bulk substrate 32 typically and preferably comprises lightly conductively doped silicon (i.e., a dopant concentration of $2 \times 10^{15}$ atoms/cm$^3$). A layer 34 of a first material is provided atop bulk substrate 32 to a first selected thickness. Layer 34 in this described embodiment preferably comprises an oxide, such as $SiO_2$, which is thermally grown or deposited. The first selected thickness is preferably from about 100 Angstroms to about 500 Angstroms.

A layer 36 of a second material is provided atop the substrate on layer 34 to a second selected thickness. The second material of layer 36 is selectively etchable relative to the first material of layer 34. An example and preferred material is polysilicon, with the second selected thickness preferably being from about 100 Angstroms to about 1000 Angstroms. For purposes of the continuing discussion, layer 36 defines an upper substrate surface 37.

A sacrificial layer 38 of a selected etch stop material is provided to a third selected thickness atop the substrate on layer 36 of second material. The etch stop material is selectively etchable relative to the second material, and preferably comprises a nitride such as $Si_3N_4$. The preferred third selected thickness is from about 500 Angstroms to about 3000 Angstroms.

Figure 3:
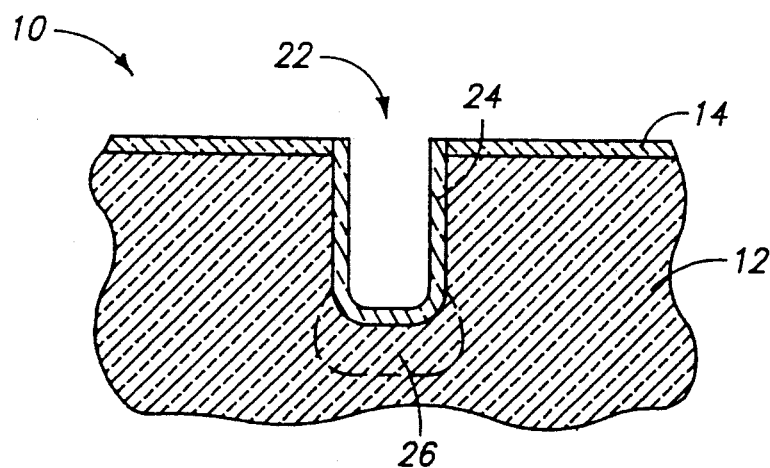
FIG. 3 is a view of the FIG. 1 wafer at a prior art processing step subsequent to that illustrated by FIG. 2.
Figure 4:
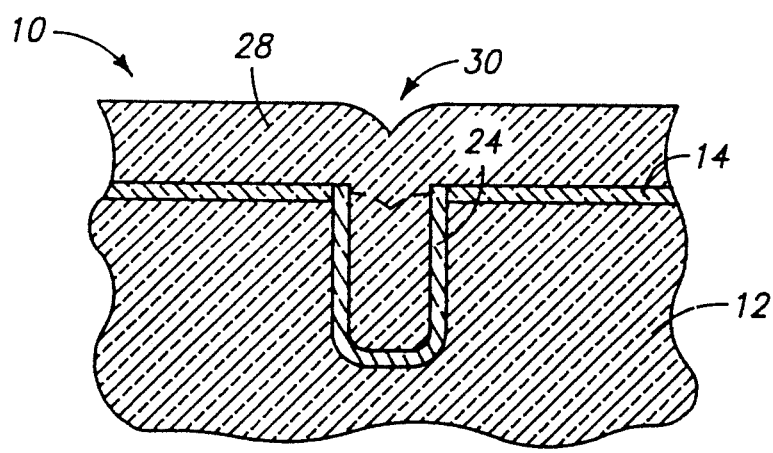
FIG. 4 is a view of the FIG. 1 wafer at a prior art processing step subsequent to that illustrated by FIG. 3.
Figure 5:
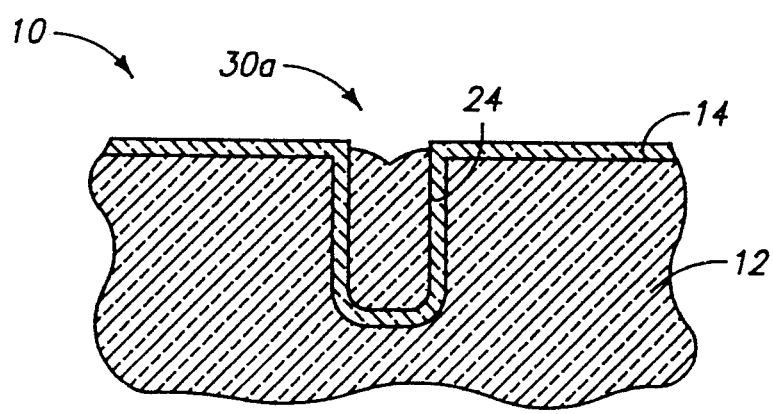
FIG. 5 is a view of the FIG. 1 wafer at a prior art processing step subsequent to that illustrated by FIG. 4.
Figure 6:
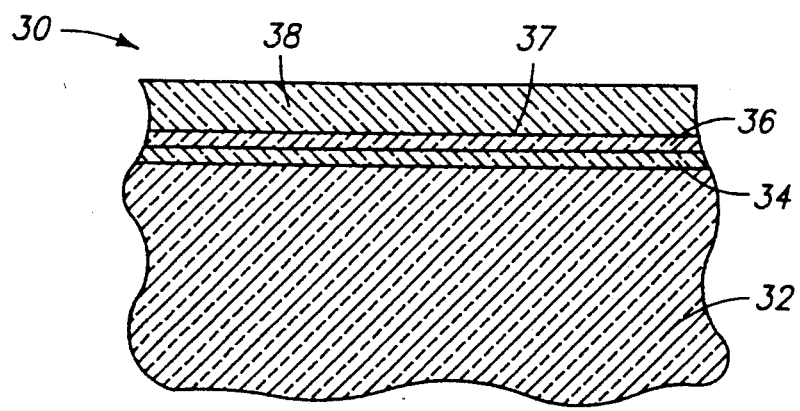
FIG. 6 is a diagrammatic section of a semiconductor wafer fragment at one processing step in accordance with the invention.
Figure 7:
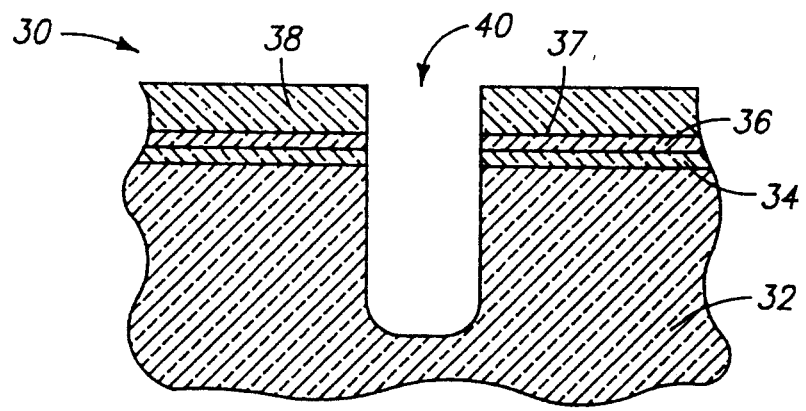
FIG. 7 is a view of the FIG. 6 wafer at a processing step subsequent to that illustrated by FIG. 6.

Referring to FIG. 7, sacrificial layer 38, second material layer 36, first material layer 34 and bulk substrate 32 are patterned and sequentially etched to define an isolation trench 40. If desired, an isolation implant could be provided at the base of trench 40 analogous to implant 26 of the prior art FIG. 3.

Figure 8:
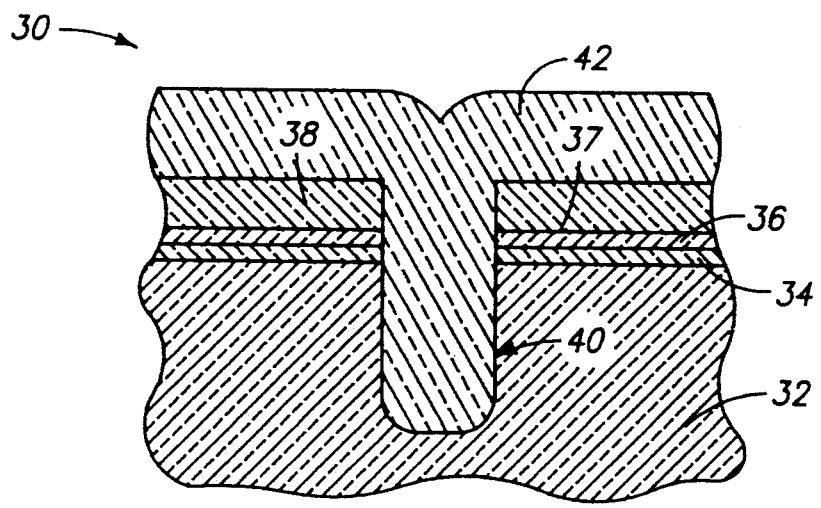
FIG. 8 is a view of the FIG. 6 wafer at a processing step subsequent to that illustrated by FIG. 7.

Referring to FIG. 8, a trench filling material layer 42 is deposited to a fourth selected thickness atop the substrate and within and filling isolation trench 40. The trench filling material is selectively etchable relative to the second material, with the second material being selectively etchable relative to the trench filling material. Additionally, the etch stop material is selectively etchable relative to the trench filling material. An example preferred trench filling material in accordance with this described embodiment is oxide, such as $SiO_2$. Such could be deposited by known techniques such as TEOS deposition, and could be doped with boron and/or phosphorus as desired. The preferred fourth selected thickness is from about 2000 Angstroms to about 3000 Angstroms, and depends on trench size. For example, the shallower the trench, the shallower the preferred fourth selected thickness.

Figure 9:
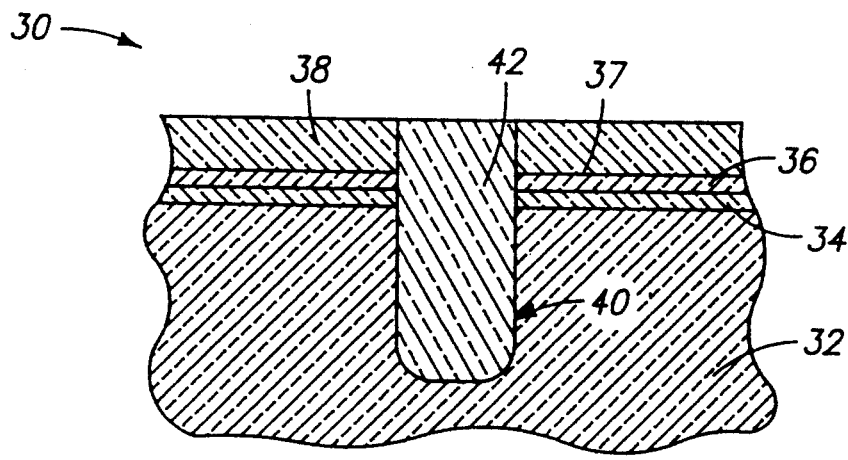
FIG. 9 is a view of the FIG. 6 wafer at a processing step subsequent to that illustrated by FIG. 8.

Referring to FIG. 9, layer 42 is subjected to a planarized etching technique using sacrificial layer 38 as an effective etch stop for such planarized etching. By far the most preferred planarized etching technique in accordance with this invention is chemical mechanical polishing (CMP). Where layer 42 comprises oxide and layer 38 comprises a nitride, an example CMP slurry would include abrasive $SiO_2$ particles in a KOH slurry. Such would provide an etch rate of 0.3 microns per minute to produce the construction as depicted in FIG. 9.

Figure 10:
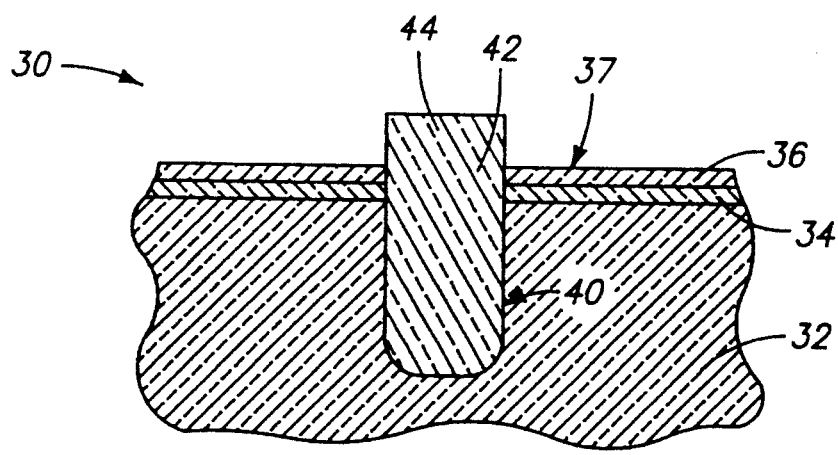
FIG. 10 is a view of the FIG. 6 wafer at a processing step subsequent to that illustrated by FIG. 9.

Referring to FIG. 10, sacrificial layer 38 is etched from the substrate selectively relative to the second material of layer 36 and trench filling material 42, thereby leaving a pillar 44 of trench filling material projecting upwardly from second material layer 36. In this manner, sacrificial layer 38 is etched from the substrate thereby leaving a pillar of trench filling material projecting upwardly relative to an upper substrate surface, such as surface 37.

Figure 11:
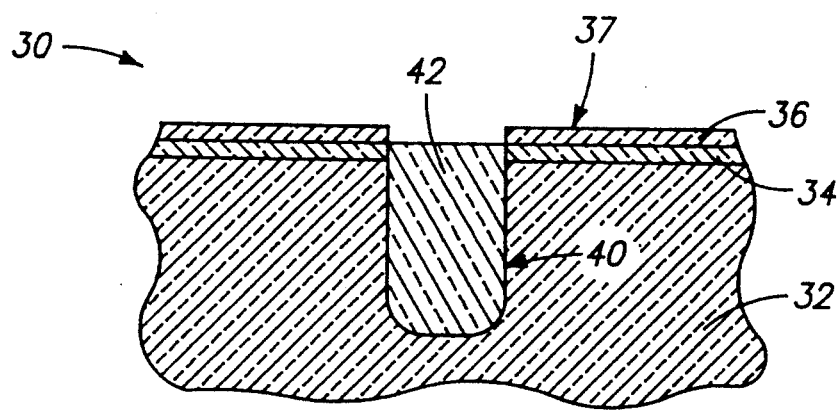
FIG. 11 is a view of the FIG. 6 wafer at a processing step subsequent to that illustrated by FIG. 10.

Referring to FIG. 11, projecting pillar 44 is selectively etched relative to second material layer 36, and correspondingly relative to upper substrate surface 37, leaving material 42 within trench 40. Preferably and as depicted, such etching is preferably conducted to etch pillar 44 downwardly to an elevation which is just beneath second material layer 36, which is also higher than or above the upper surface of silicon substrate material 32.

Figure 12:
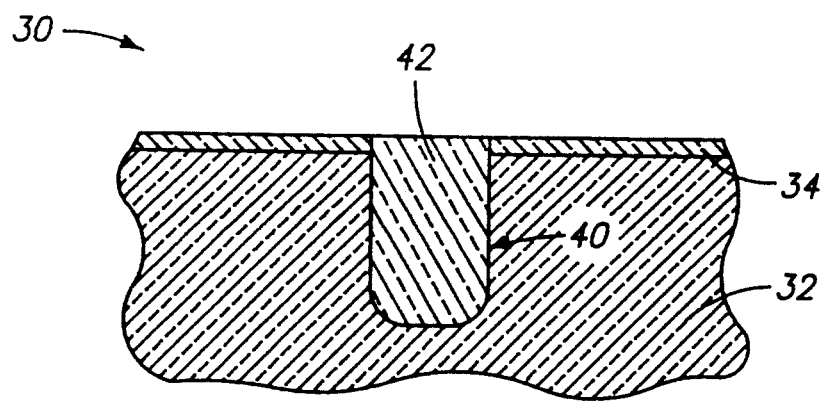
FIG. 12 is a view of the FIG. 6 wafer at a processing step subsequent to that illustrated by FIG. 11.

Referring to FIG. 12, second material layer 36 is etched from the substrate selectively relative to the first material of layer 34 and the trench filling material. Where layer 36 comprises polysilicon, example etching conditions would include utilizing a wet polysilicon $HF/HNO_3/H_2O$ chemistry which provides excellent selectivity to oxide.

Figure 13:
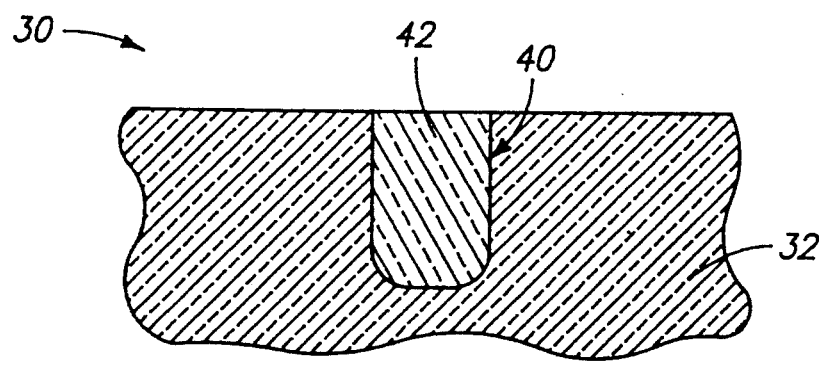
FIG. 13 is a view of the FIG. 6 wafer at a processing step subsequent to that illustrated by FIG. 12.

Referring to FIG. 13, layer 34 and a corresponding equivalent thickness of trench material 42 are etched to provide the illustrated isolation trench 40, as shown.

Figure 14:
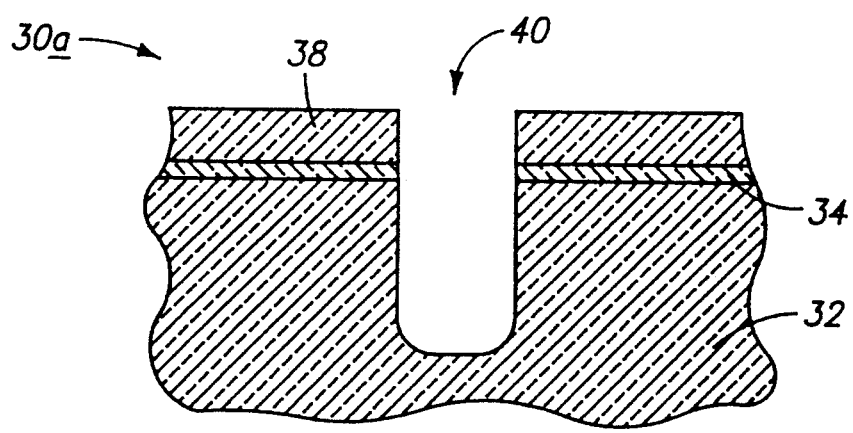
FIG. 14 a diagrammatic section of a semiconductor wafer fragment at one processing step in accordance with alternate methods of the invention.

An alternative process in accordance with the invention is depicted by FIGS. 14-19. Numerals common for layers of the embodiment of FIGS. 6-13 and the embodiment of FIGS. 14-19 have identically been used where appropriate. FIG. 14 illustrates an alternate substrate 30a having a trench 40 provided therein. FIG. 14 differs from the first described embodiment as depicted in FIG. 7 in that no polysilicon layer, such as layer 36 in FIG. 7, has been provided. Other layers are otherwise as shown in the FIGS. 6-13 embodiment. If desired, an isolation implant could be provided at the base of trench 40 analogous to implant 26 of the prior art FIG. 3.

Figure 15:
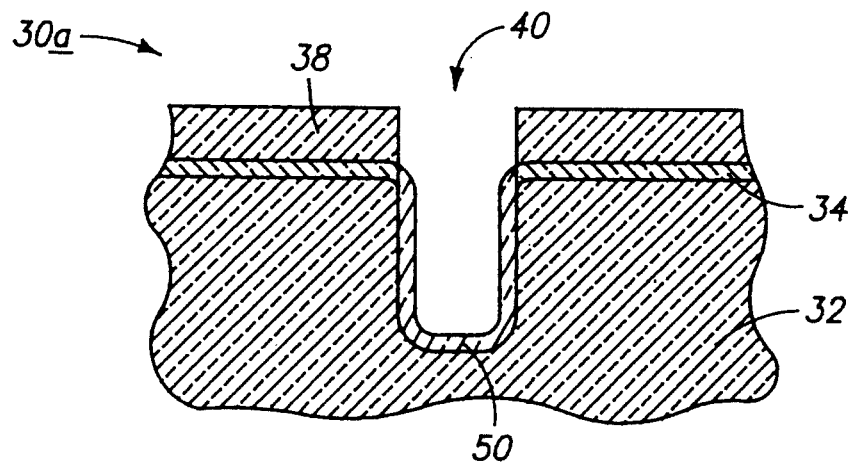
FIG. 15 is a view of the FIG. 14 wafer at a processing step subsequent to that illustrated by FIG. 14.

Referring to FIG. 15, a trench coating 50 of insulating material is provided within and about the sidewalls and base of trench 40. Trench coating 50 can be provided or grown by exposing substrate 30a to oxidizing conditions.

Figure 16:
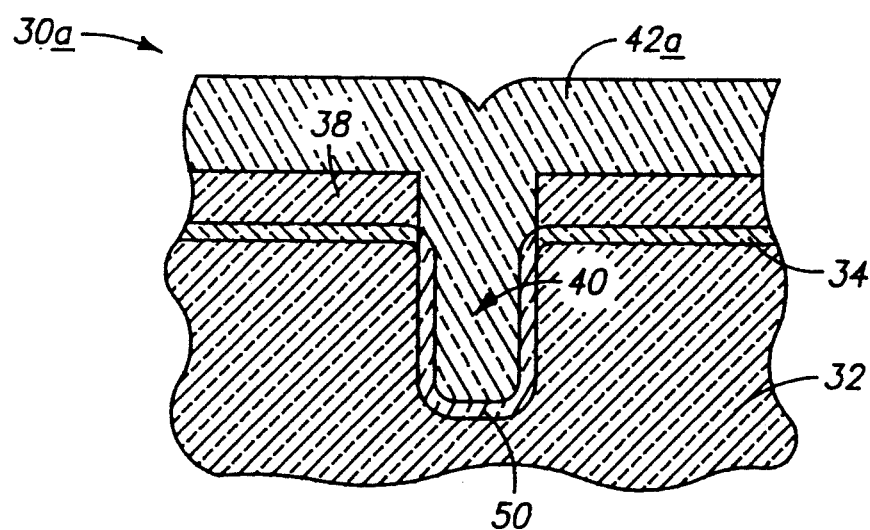
FIG. 16 is a view of the FIG. 14 wafer at a processing step subsequent to that illustrated by FIG. 15.

Referring to FIG. 16, a trench filling material layer 42a preferably of polysilicon is deposited to the fourth selected thickness. As layer 42a comprises polysilicon which in the described embodiment is of the same predominant material as bulk silicon substrate 32, insulating or isolating material trench coating 50 was provided to prevent contact of bulk substrate 32 (silicon) with polysilicon material 42a within trench 40.

Referring to FIG. 17, layer 42a is subjected to planarized etching, again preferably by CMP, using etch stop layer 38 as an effective etch stop for such planarized etching.

Referring to FIG. 18, sacrificial layer 38 is etched from the substrate selectively relative to the trench filling polysilicon and first oxide layer 34, thereby leaving projecting pillar 44 of material 42a.

Figure 19:
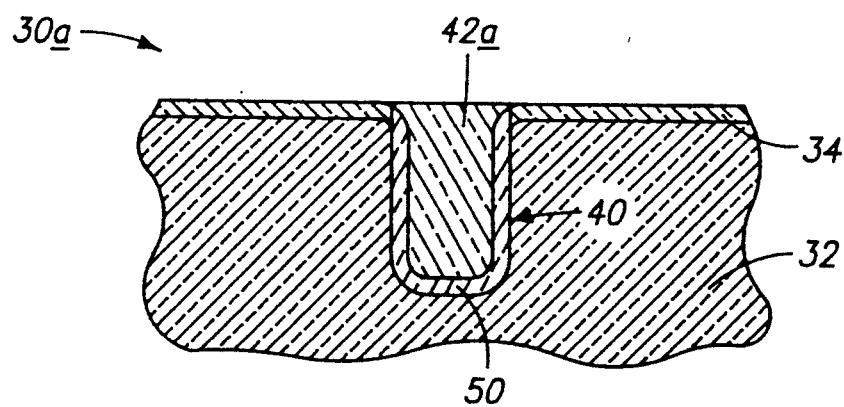
FIG. 19 is a view of the FIG. 14 wafer at a processing step subsequent to that illustrated by FIG. 18.

Referring to FIG. 19, projecting pillar 44 is thereafter selectively etched relative to first oxide layer 34. Note that this alternate described embodiment eliminates the necessity of depositing the additional layer 36, but does result in the providing of a trench coating layer 50. From here, layers 34 and an equivalent thickness of material 42a could be etched from the wafer, if desired.

The above described techniques provide the advantages over the prior art of, among others, providing relatively planar trench fill material which is flush with the silicon surface/trench edge. The use of the claimed etch stop materials combined with the trench etch is novel and unobvious because it allows for the etch back for the trench fill material after CMP or other planarize etching without affecting the silicon surface where transistors will be subsequently formed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method for forming a substrate isolation trench comprising the following step:
   providing a layer of polysilicon atop a substrate to a selected thickness;
   providing a sacrificial layer of a selected etch stop material to a selected thickness atop the layer of polysilicon;
   patterning and etching through the sacrificial layer and selected material layer, and into the substrate to define an isolation trench;
   depositing a trench filling material to a selected thickness atop the substrate and within and filling the isolation trench;
   planarize etching the trench filling material using the sacrificial layer as an effective etch stop for such planarize etching;
   etching the sacrificial layer from the substrate and thereby leaving a pillar of trench filling material projecting upwardly relative to an upper substrate surface; and
   selectively etching the projecting pillar relative to the upper substrate surface.

2. The semiconductor processing method for forming a substrate isolation trench of claim 1 wherein the step of planarize etching comprises chemical mechanical polishing.

3. The semiconductor processing method for forming a substrate isolation trench of claim 1 wherein the selected thickness of the polysilicon layer is from about 100 Angstroms to about 1000 Angstroms.

4. The semiconductor processing method for forming a substrate isolation trench of claim 1 wherein the selected thickness of the etch stop material layer is from about 500 Angstroms to about 3000 Angstroms.

5. The semiconductor processing method for forming a substrate isolation trench of claim 1 wherein the etch stop material comprises a nitride.

6. The semiconductor processing method for forming a substrate isolation trench of claim 1 wherein the selected thickness of the polysilicon layer is from about 100 Angstroms to about 1000 Angstroms, and the selected thickness of the etch stop material layer is from about 500 Angstroms to about 3000 Angstroms.

7. The semiconductor processing method for forming a substrate isolation trench of claim 1 wherein the etch stop material comprises a nitride, and the step of planarize etching comprises chemical mechanical polishing.

8. A semiconductor processing method for forming a substrate isolation trench comprising the following steps:
providing a layer of selected material atop a substrate to a first selected thickness;
providing a layer of polysilicon atop the substrate to a second selected thickness, the polysilicon being selectively etchable relative to the selected material;
providing a sacrificial layer of a selected etch stop material to a third selected thickness atop the layer of polysilicon, the etch stop material being selectively etchable relative to the polysilicon;
patterning and etching through the sacrificial layer, layer of polysilicon and layer of selected material, and into the substrate to define an isolation trench;
depositing a layer of trench filling material to a fourth selected thickness atop the substrate and within the isolation trench, the trench filling material being selectively etchable relative to the polysilicon, the polysilicon being selectively etchable relative to the trench filling material, the etch stop material being selectively etchable relative to the trench filling material;
planarize etching the trench filling material using the sacrificial layer as an effective etch stop for such planarize etching;
etching the sacrificial layer from the substrate selectively relative to the polysilicon and trench filling material, and thereby leaving a pillar of trench filling material projecting upwardly relative to the polysilicon layer;
selectively etching the projecting pillar relative to the layer of polysilicon; and
etching the polysilicon from the substrate selectively relative to the selected material and trench filling material.

9. The semiconductor processing method for forming a substrate isolation trench of claim 8 wherein the step of planarize etching comprises chemical mechanical polishing.

10. The semiconductor processing method for forming a substrate isolation trench of claim 8 wherein the selected material comprises an oxide.

11. The semiconductor processing method for forming a substrate isolation trench of claim 8 wherein the second thickness is from about 100 Angstroms to about 1000 Angstroms.

12. A semiconductor processing method for forming a substrate isolation trench comprising the following steps:
providing a layer of first material atop a substrate to a first selected thickness;
providing a layer of second material atop the substrate to a second selected thickness, the second material being selectively etchable relative to the first material;
providing a sacrificial layer of nitride to a third selected thickness atop the layer of second material, the nitride being selectively etchable relative to the second material;
patterning and etching through the sacrificial nitride layer, layer of second material and layer of first material, and into the substrate to define an isolation trench;
depositing a layer of trench filling material to a fourth selected thickness atop the substrate and within the isolation trench, the trench filling material being selectively etchable relative to the second material, the second material being selectively etchable relative to the trench filling material, the nitride being selectively etchable relative to the trench filling material;
planarize etching the trench filling material using the sacrificial nitride layer as an effective etch stop for such planarize etching;
etching the sacrificial nitride layer from the substrate selectively relative to the second material and trench filling material, and thereby leaving a pillar of trench filling material projecting upwardly relative to the second material layer;
selectively etching the projecting pillar relative to the layer of second material; and
etching the second material from the substrate selectively relative to the first material and trench filling material.

13. A semiconductor processing method for forming a substrate isolation trench comprising the following steps:
providing a layer of first material atop a substrate to a first selected thickness;
providing a layer of second material atop the substrate to a second selected thickness, the second material being selectively etchable relative to the first material;
providing a sacrificial layer of a selected etch stop material to a third selected thickness atop the layer of second material, the etch stop material being selectively etchable relative to the second material;
patterning and etching through the sacrificial layer, layer of second material and layer of first material, and into the substrate to define an isolation trench;
depositing a layer of trench filling material to a fourth selected thickness atop the substrate and within the isolation trench, the trench filling material being selectively etchable relative to the second material, the second material being selectively etchable relative to the trench filling material, the etch stop material being selectively etchable relative to the trench filling material;

planarize etching the trench filling material using the sacrificial layer as an effective etch stop for such planarize etching;

etching the sacrificial layer from the substrate selectively relative to the second material and trench filling material, and thereby leaving a pillar of trench filling material projecting upwardly relative to the second material layer;

selectively etching the projecting pillar relative to the second material downwardly to an elevation beneath the second material layer; and etching the second material from the substrate selectively relative to the first material and trench filling material.

14. A semiconductor processing method for forming a substrate isolation trench comprising the following steps:

providing a layer of first material atop a substrate to a first selected thickness;

providing a layer of polysilicon atop the substrate to a second selected thickness;

providing a sacrificial layer of a selected etch stop material to a third selected thickness atop the layer of polysilicon, the etch stop material being selectively etchable relative to polysilicon;

patterning and etching through the sacrificial layer, polysilicon layer and layer of first material, and into the substrate to define an isolation trench;

depositing a layer of oxide to a fourth selected thickness atop the substrate and within the isolation trench to fill the isolation trench, the etch stop material being selectively etchable relative to oxide;

planarize etching the trench filling oxide using the sacrificial layer as an effective etch stop for such planarize etching;

etching the sacrificial layer from the substrate selectively relative to the trench filling oxide and polysilicon layer, and thereby leaving a pillar of oxide projecting upwardly relative to the polysilicon layer;

selectively etching the projecting pillar relative to the polysilicon layer; and etching the polysilicon layer from the substrate selectively relative to the first material and trench filling oxide.

15. The semiconductor processing method for forming a substrate isolation trench of claim 14 wherein the step of planarize etching comprises chemical mechanical polishing.

16. The semiconductor processing method for forming a substrate isolation trench of claim 14 wherein the first material comprises an oxide.

17. The semiconductor processing method for forming a substrate isolation trench of claim 14 wherein the etch stop material comprises a nitride.

18. The semiconductor processing method for forming a substrate isolation trench of claim 14 wherein the step of planarize etching comprises chemical mechanical polishing, the first material comprises an oxide and the etch stop material comprises a nitride.

19. The semiconductor processing method for forming a substrate isolation trench of claim 14 wherein the step of etching the projecting pillar comprises etching the pillar downwardly to an elevation beneath the polysilicon layer.

20. A semiconductor processing method for forming a substrate isolation trench comprising the following steps:

providing a first layer of oxide atop a substrate to a first selected thickness;

providing a sacrificial layer of a selected etch stop material to a second selected thickness atop the oxide layer, the etch stop material being selectively etchable relative to oxide;

patterning and etching through the sacrificial layer and oxide layer, and into the substrate to define an isolation trench;

providing a trench coating insulating layer within the trench;

depositing a layer of polysilicon to a third selected thickness atop the substrate and within the isolation trench to fill the isolation trench, the etch stop material being selectively etchable relative to polysilicon;

planarize etching the trench filling polysilicon using the sacrificial layer as an effective etch stop for such planarize etching;

etching the sacrificial layer from the substrate selectively relative to the trench filling polysilicon and first oxide layer, and thereby leaving a pillar of polysilicon projecting upwardly relative to the first oxide layer; and selectively etching the projecting pillar relative to the first oxide layer.

21. The semiconductor processing method for forming a substrate isolation trench of claim 20 wherein the step of planarize etching comprises chemical mechanical polishing.

22. The semiconductor processing method for forming a substrate isolation trench of claim 20 wherein the etch stop material comprises a nitride.

23. The semiconductor processing method for forming a substrate isolation trench of claim 20 wherein the trench coating insulating layer comprises an oxide.

24. The semiconductor processing method for forming a substrate isolation trench of claim 20 wherein the step of planarize etching comprises chemical mechanical polishing and the etch stop material comprises a nitride.

* * * * *

UNITED STATES PATENT AND TRADEMARK OFFICE
CERTIFICATE OF CORRECTION

PATENT NO.   : 5,229,316

DATED        : July 20, 1993

INVENTOR(S)  : Roger R. Lee; Fernando Gonzalez

It is certified that error appears in the above-identified patent and that said Letters Patent is hereby corrected as shown below:

Title page,
    Under Assignee [73], change "Iowa" to --Idaho--.

Signed and Sealed this

Fifth Day of April, 1994

Attest:

BRUCE LEHMAN

*Attesting Officer*    Commissioner of Patents and Trademarks